United States Patent [19]
Rice et al.

[11] Patent Number: 4,795,922
[45] Date of Patent: Jan. 3, 1989

[54] AMPLITUDE AND PHASE DISCRIMINATOR USING ALL-PASS NETWORKS

[75] Inventors: Christopher W. Rice; Seward T. Salvage, both of Palm Bay, Fla.

[73] Assignee: Harris Corp., Melbourne, Fla.

[21] Appl. No.: 36,470

[22] Filed: Apr. 9, 1987

[51] Int. Cl.[4] .......................... H03L 7/00; H03K 9/06
[52] U.S. Cl. .................................. 307/511; 307/262; 328/133; 328/155
[58] Field of Search ................................ 307/510–514, 307/516, 262; 328/55, 109, 133, 134, 155; 333/138, 139

[56] References Cited

U.S. PATENT DOCUMENTS

| | | | |
|---|---|---|---|
| 2,751,555 | 6/1956 | Kirkpatrick | 328/134 |
| 2,984,799 | 5/1961 | Gerks | 328/55 |
| 3,577,088 | 5/1971 | Goggins, Jr. | 328/134 |
| 3,621,406 | 11/1971 | Paine | 307/262 |
| 3,976,958 | 8/1976 | Seidel | 328/167 |
| 4,581,595 | 4/1986 | Silagi | 333/138 |

OTHER PUBLICATIONS

Mondal et al., "Phase Shifts in Single and Dual Gate GaAs MESFET's . . .", IEEE MTT Trans., vol. MTT 32N010, Oct. 84, pp. 1280–1287.
Suckling et al., "S-Band Shifter Using Mono. GaAs Circuits", ISSCC Digest of Tech. Papers, Feb. 1982, pp. 134–135.

Primary Examiner—Stanley D. Miller
Assistant Examiner—Timothy P. Callahan
Attorney, Agent, or Firm—Antonelli, Terry & Wands

[57] ABSTRACT

An amplitude/phase discriminator network the entirety of which is integrated on the same (GaAs) semiconductor chip, obtains a quadrature phase split through the use of a pair of orthogonal phase generators each of which comprises an all-pass network coupled with a pair of differential amplifiers. An unknown signal of interest, the phase and amplitude of which are to be derived, is applied to one pair of all-pass networks, while a reference signal, the amplitude and phase of which are known, is applied to the other pair of all-pass networks. Four quadrature outputs produced by the differential amplifiers contained within the pair of orthogonal phase generators are selectively coupled to a signal combining stage comprised of a diode detector-low pass filter network. At the output of this network there are produced a set of output signals each of which has a magnitude component representative of the magnitudes of the unknown and reference signals and a phase component representative of the difference between the phases of the reference and unknown signals. Since the amplitude and phase of the reference signal are known, the amplitude and phase of the unknown signal can be readily determined.

9 Claims, 3 Drawing Sheets

AMPLITUDE AND PHASE DISCRIMINATOR USING ALL-PASS NETWORKS

FIELD OF THE INVENTION

The present invention relates in general to communication systems and is particularly directed to an amplitude and phase discriminator employing all-pass network components.

BACKGROUND OF THE INVENTION

Large scale signal processing arrays, such as those incorporated in (transmit/receive) adaptive radar systems, typically evaluate a signal of interest through the use of an amplitude/phase discriminator network. Such a network customarily employs large-sized microstrip or stripline elements, such as Lange couplers, to split a reference signal and an unknown signal into a set of (four) phase quadrature vectors. These vectors are then controllably combined (summed), diode-detected and low-pass filtered to produce a set of output signals from which amplitude and phase information for the unknown signal can be derived. In a system that may employ thousands of elements (e.g. ground-based array for early warning radar), an important design consideration is the ability of the system to be implemented using monolithic microwave integrated circuits (MMICs), which offer low cost, miniaturization and high reliability. Disadvantageously, however, at L-band, Lange couplers are large, bulky microstrip devices that occupy an inordinate amount of (GaAs) substrate real estate, thereby effectively preventing their integration with other signal processing components on the same chip.

SUMMARY OF THE INVENTION

In accordance with the present invention, the physical size limitations of the (Lange coupler) components of conventional amplitude/phase discriminator networks are obviated by a circuit design approach which enables the entirety of the network to be integrated on the same (GaAs) semiconductor chip, thereby conforming with system MMIC fabrication and cost objectives. To this end the amplitude/phase discriminator of the present invention obtains a quadrature phase split through the use of a pair of orthogonal phase generators each of which comprises an all-pass network coupled with a pair of differential amplifiers. The unknown signal of interest, the phase and amplitude of which are to be derived, is applied to one pair of all-pass networks, while a reference signal, the amplitude and phase of which are known, is applied to the other identical pair of all-pass networks. Four quadrature outputs produced by the differential amplifiers contained within the pair of orthogonal phase generators are selectively coupled to a signal combining stage comprised of a diode detector-low pass filter network. At the output of this network there are produced a set of output signals each of which has a magnitude component representative of the magnitudes of the unknown and reference signals and a phase component representative of the difference between the phases of the reference and unknown signals. Since the amplitude and phase of the reference signal are known, the amplitude and phase of the unknown signal can be readily determined.

BRIEF DESCRIPTION OF THE DRAWINGS

FIG. 3 is a vector diagram illustrating a set of four orthogonal vectors produced by the orthogonal phase vector generator stages shown in detail of FIG. 2.

DETAILED DESCRIPTION

Figure 1:
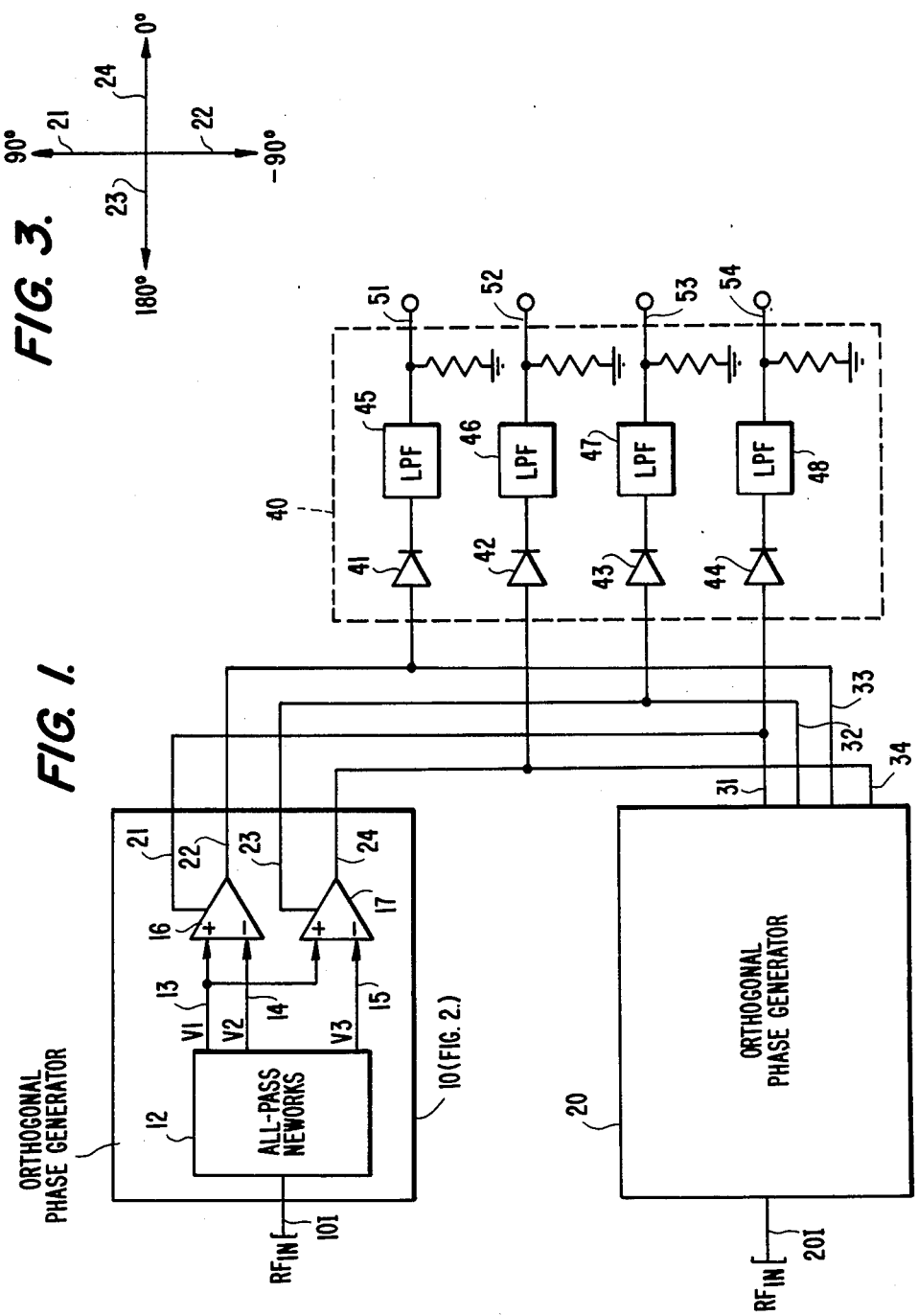
FIG. 1 is a schematic block diagram of a monolithic amplitude/phase discriminator according to the present invention.

Referring now to FIG. 1, a schematic block diagram of the monolithic amplitude/phase discriminator according to the present invention is shown as comprising a first orthogonal phase generator stage 10 coupled to receive an input signal over input link 10I and having four output links 21–24 coupled to a downstream signal combining stage 40. The input signal on link 10I is assumed to be an unknown signal of interest the amplitude A and phase angle $\theta$ of which relative to those (B and $\Phi$) of a reference signal are to be determined. The reference signal is coupled to an input link 20I of a second orthogonal phase generator stage 20, having a set of four output links 31–34 which are also coupled to downstream signal combining stage 40.

Each of orthogonal phase generator stages 10 and 20 is preferably configured in the manner described in copending patent applications Ser. No. 851,726, filed Apr. 14, 1986, and entitled "Monolithic Vector Modulator/Complex Weight Using All-Pass Network" by S.T. Salvage et al and assigned to the Assignee of the present application. As described in that application and as detailed hereinafter, each orthogonal phase generator stage is preferably configured in the manner shown in FIG. 2, to be described below, to produce a set of four mutually orthogonal vector signals respectively shifted in phase relative to the input link of the orthogonal phase generator stage and having relative values 0°, +90°, +180°, −90°, as shown in the vector diagram of FIG. 3, and as respectively denoted adjacent to output links 21–24 and 31–34 of stages 10 and 20 shown in FIG. 1.

Each of output links 21–24 from orthogonal phase vector generator stage 10 produces an output signal the amplitude A of which corresponds to the amplitude A of the unknown input signal applied to input link 10I and a phase component referenced to the phase $\theta$ of the input signal on link 10I.

Similarly, output links 31–34 from orthogonal phase vector generator stage 20 produce a signal having an amplitude corresponding to the amplitude B of the reference signal supplied over input link 20I and a phase referenced to the phase $\Phi$ of the signal applied to input link 20I. Each of links 21–24 is selectively combined with one of the links 31–34 in signal combining circuit 40 to produce output signals V10, V20, V30 and V40 on output links 51–54 from which amplitude and phase information of the input signal may be derived. For this purpose, each of links 21–24 and a selected one of links 31–34 is coupled to a respective square law detecting diode 41–44 in signal combining stage 40, the outputs of which are applied to respective low filters 45–48. Diodes 41–44 effectively square the sum of the two phase vector signal components applied thereto from one of each of the set of output links 21-24 from orthogonal phase generator stage 10 and output links 31-34 of orthogonal phase generator stage 20. The resultant signals are low pass filtered to remove higher order frequency terms so that, in effect, only the lower order components (DC) are supplied as DC output voltages on links 51-54.

The voltages are supplied to downstream processing circuitry from which the amplitude A and phase $\theta$ of the unknown input signal on link 10I may be derived. That processing circuitry preferably comprises a set of operational amplifiers or programmed digital processor, inputs of which are coupled from the outputs of an analog-to-digital converter which is coupled to receive the DC voltages supplied over links 51-54.

More specifically, the DC terms represented by voltages V10 . . . V40 produced by signal combining stage 40 may be expressed as follows:

$$V1 = k(A^2 + B^2 - 2AB \sin \alpha),$$

$$V2 = k(A^2 + B^2 + 2AB \cos \alpha),$$

$$V3 = k(A^2 + B^2 + 2AB \sin \alpha), \text{ and}$$
$$V4 = k(A^2 + B^2 + 2AB \cos \alpha),$$

wherein $\alpha = \theta - \Phi$. Since both $\Phi$ and B are known entities (from the reference signal applied to link 20I of orthogonal phase vector generator stage 20) a determination of the amplitude A and the phase angle $\theta$ of the signal applied to link 10I is a straightforward trigonometric exercise executed by the downstream processor coupled to links 51-54.

In particular, with the above set of relationships,
$$V1 + V3 = 2k(A^2 + B^2), \text{ so that}$$

$$B = ((V1+V3)/2k)^{\frac{1}{2}} - A.$$

Also, $V3 - V1 = 4kAB \sin \alpha$, and $(V2+V4)-(V1+V3) = 4kAB \cos \alpha.$ Therefore, $$\alpha = \text{Tan}^{-1}((V3-V1)/(V2+V4-V1-V3)).$$

Since $\alpha = \theta - \Phi$, the phase angle $\theta$ of the input signal on line 10I is readily determined.

Figure 2:
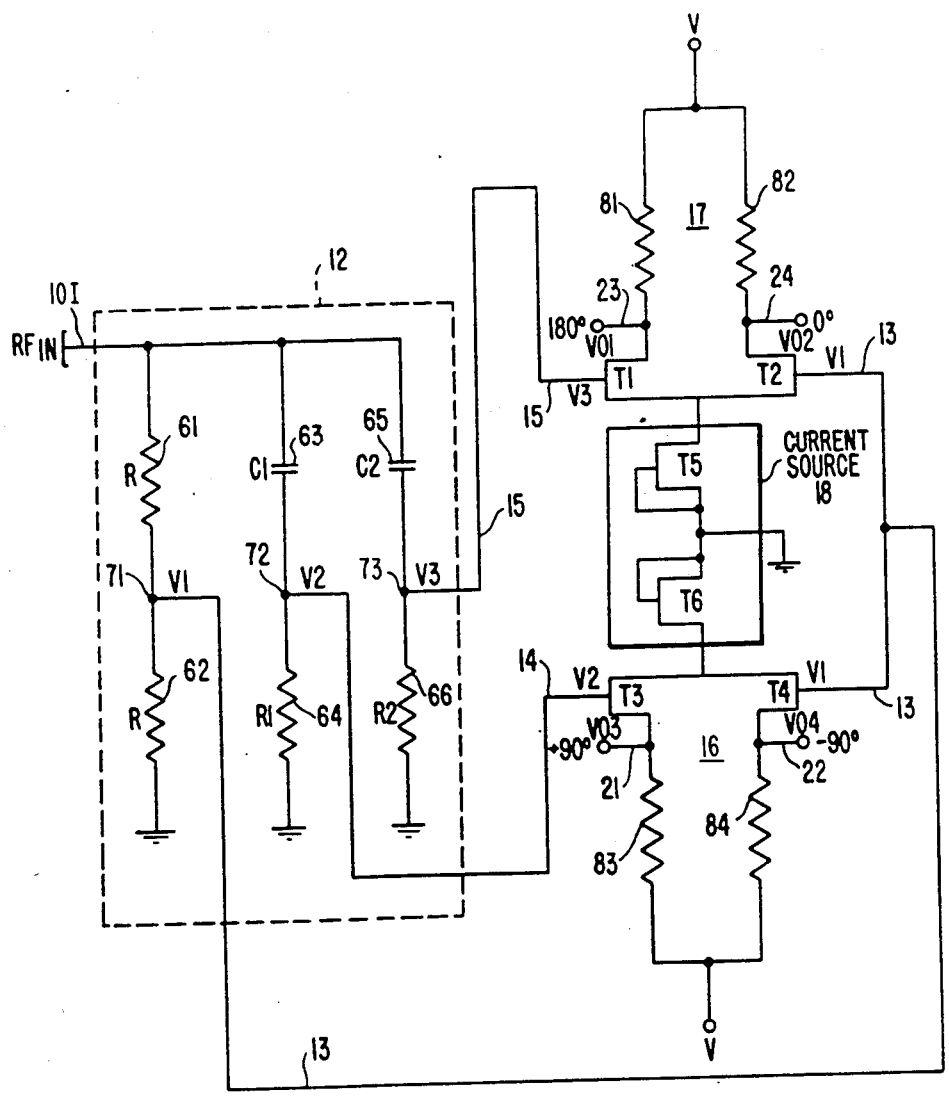
FIG. 2 is a detailed schematic diagram of the orthogonal phase vector generator stages 10 and 20 of FIG. 1.

Referring now to FIG. 2, the internal configuration of orthogonal phase vector stage 10 is shown in detail. Since the internal configuration of orthogonal phase vector generator stage 20 is identical to that of stage 10, a detailed description of stage 20 will not be presented. Suffice it to say, however, that both stages, as well as the remaining components of the discriminator shown in FIG. 1, reside on a common semiconductor (e.g. gallium arsenide) chip, and thereby provide a practical monolithic implementation of the phase discriminator which obviates the drawbacks of conventional mechanisms (employing Lange couplers), described supra.

As shown in FIG. 2, orthogonal phase generator stage 10 is comprised of an all-pass network 12 coupled to input link 10I and having respective output links 13, 14 and 15 feeding a pair of differential amplifier circuits 16 and 17. All-pass network 12 contains a first resistive voltage divider network comprised of resistors 61 and 62 coupled between input link 10I and a reference potential terminal (ground). Node 71 between resistors 61 and 62 is coupled over link 13 to the gate inputs of respective field effect transistors T2 and T4 of the differential amplifier circuit pair 16 and 17. Coupled in parallel with the resistive voltage divider network are a pair of passive, phase shifting RC networks comprised of a series connection of capacitor 63 and resistor 64 between input link 10I and ground, and a series connection of a capacitor 65 and the resistor 66 between input link 10I and ground. Node 72 between capacitor 63 and resistor 64 is coupled over link 14 to the gate input of field effect transistor T3 of differential amplifier circuit 16. The voltage at node 73, at the junction between capacitor 65 and resistor 66, is coupled over link 15 to the gate input of field effect transistors T1 of differential amplifier 17. A first all-pass transfer function is defined by the difference voltage between nodes 72 and 71, while a second all-pass transfer function is defined by the difference voltage between nodes 73 and 71.

A current source 18, comprised of transistors T5 and T6, is coupled to the source electrodes of transistors T1-T4 of differential amplifier circuits 16 and 17, as shown, while the drains thereof are coupled through resistors 81-84, respectively, to a bias potential source V.

In operation, all-pass network 12 splits the input signal coupled over link 10I into a pair of components of differing phase but having the same amplitude, over an extremely wide bandwidth. For L band frequencies (600 MHz-1,400 MHz) amplitude variations are within ±0.5 dB and phase variations are within ±2° of the intended phase vector value. The particular phase difference is selected by adjusting the values of the resistor/capacitor components of 11 all pass phase splitting network 12. (For a description of the make-up and operation of an all-pass phase splitting network, attention may be directed to literature on the subject, including an article "Normalized Design of 90°. Phase-Difference Networks" by S.D. Bedrosian, IRE Transactions on Circuit Theory, June 1960, an article entitled "90° Phase-Difference Network are Simplified Design with a Program in Basic" by J.E. Loyd, Electronic Design 19, Sept. 13, 1976 and an article entitled "Design of RC Wide-Band 90° Phase-Difference Network" by Donald K. Weaver, IRE Proceedings, Apr. 1954.)

The respective output voltages V1, V2 and V3 on links 13, 14 and 15 from all-pass network 12 are applied to the pair of differential amplifier circuits 16 and 17 to obtain complementary voltage difference outputs on links 21-24, respectively representative of the voltage differences (V1-V2) and (V1-V3). The voltage relationships of the all-pass network 12 for defining the values of V1, V2 and V3 in accordance with the resistor, capacitor components may be expressed as:

$V1-V2 = (sR1C1-1)/(sR1C1+1)(Vn/2)$, and
$V1-V3 = (sR2C2-1)/(SR2C2+1)(Vn/2)$, (where $s=j\omega$).

With the values of the RC components of the all-pass network 12 being selected to achieve a 90° phase split at the outputs (V1, V2, V3) thereof, differential amplifiers 16 and 17 produce, on output links 21-24, respective equal amplitude phase vector signals of +90°, −90°, +180° and 0°, as diagrammatically illustrated in FIG. 3.

Now, although the resistor-capacitor configuration of the all pass network 12 shown in FIG. 2 works well at the lower end of the band, at high frequencies the (field effect parasitic) input capacitance of the differential amplifier constitutes a significant load which distorts the all-pass effect of the circuit and changes its transfer function. More particularly, the transfer function of an all-pass network including the capacitive loading of the differential amplifier is shown in FIG. 4 and may be expressed as:

$$V2 - V1 = \frac{(sR1C1 - 1 - sR1CL + 2sR1C1sR3CL)(VI/2)}{(sR1C1 + sR1CL + sR3CL + sR1CL(sR3C1 + sR3CL))},$$

and $$V3 - V1 = \frac{(sR2C2 - 1 - sR2CL + 2sR2C2sR3CL)(VI/2)}{(sR2C2 + 1 + sR2CL + sR3CL + sR2CL(sR3C2 + sR3CL))}.$$

Figure 4:
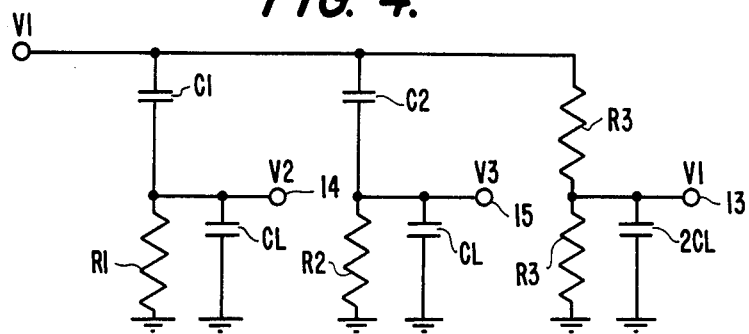
FIGS. 4, 5 and 6 are schematic diagrams of the functionality of an alternative configuration of the all-pass network employed in the orthogonal phase vector generator stages shown in detail in FIG. 2.
Figure 5:
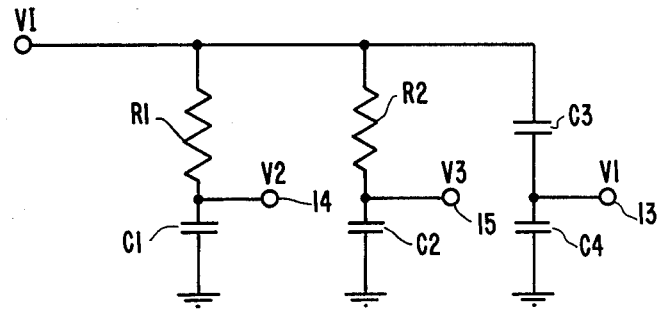

As can be seen from FIG. 4, resistor R3 has a load of 2CL, corresponding to the load effect of the input of the differential amplifier. The transfer function is clearly not an all-pass network and is fairly complex. The value of the load capacitance is small, typically on the order of 0.2 pF for a 150 micron FET differential amplifier. At low frequencies this capacitance is negligible; however, at high frequencies it becomes significant and presents a problem, so that a modified all-pass network configured as shown in FIG. 5 is required. As shown therein resistors R3 are replaced by capacitors C3 and C4. If C3 equals C4 the transfer function is identical to that of the all-pass network shown in FIG. 2. It should be noted that the capacitor-resistor substitution of FIGS. 2 and 5 does not alter the transfer function, but it does allow the network to take into account the capacitive load of the differential amplifier and retain its all-pass transfer function.

Figure 6:
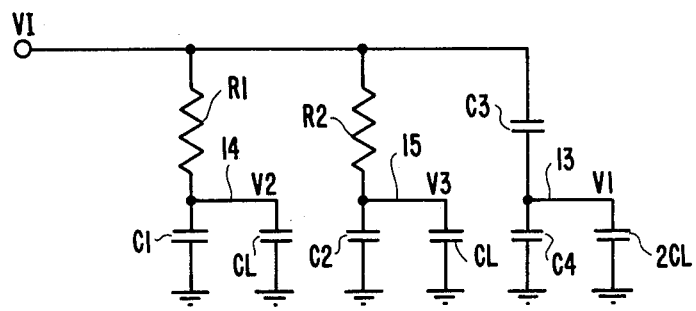

FIG. 6 illustrates the all-pass network loaded by the differential amplifier. If the values of the capacitors are selected such that:

$$C3 = C4 + 2CL$$

$$C1' = C1 + CL, \text{ and}$$

$$C2' = C2 + CL,$$

then the loaded network of FIG. 6 has all-pass characteristics corresponding to those of the network shown in FIG. 5, except that the capacitive loading of the differential amplifier is taken into account.

As will be appreciated from the foregoing description, the physical size limitations of the (Lange coupler) components of conventional amplitude/phase discriminator networks are obviated by an all-pass network circuit configuration which enables the entirety of the network to be integrated on the same (GaAs) semiconductor chip, thereby conforming with system MMIC fabrication and cost objectives. Although conventional Lange coupler designs are adequate over an octave of bandwidth for a quadrature phase split of the discriminator, their physical size is too large at L-band to be implemented on a monolithic (GaAs) substrate. Consequently, the conventional circuit approach is not repeatable as an MMIC and requires off-chip assembly.

While we have shown and described an embodiment in accordance with the present invention, it is to be understood that the same is not limited thereto but is susceptible to numerous changes and modifications as known to a person skilled in the art, and we therefore do not wish to be limited to the details shown and described herein but intend to cover all such changes and modifications are obvious to one of ordinary skill in the art.

What is claimed:

1. A signal coupling network comprising:
   a first signal coupling stage having
      first means for receiving a first input signal and for producing at a plurality of outputs thereof a plurality of first respective output signals, shifted in phase with respect to each other, and
      second means, coupled to the plurality of outputs of said first means, for selectively differentially combining said plurality of first output signals and producing therefrom a plurality of second output signals shifted in phase with respect to each other, at respective outputs thereof such that each of said second output signals is effectively phase-orthogonal with respect to another second output signal;
   a second signal coupling stage having
      third means for receiving a second input signal producing at a plurality of outputs thereof a plurality of respective third output signals, shifted in phase with respect to each other, and
      fourth means, coupled to the plurality of outputs of said third means, for selectively differentially combining said plurality of third output signals and producing therefrom a plurality of fourth output signals shifted in phase with respect to each other, at respective outputs thereof such that each of said fourth output signals is effectively phase-orthogonal with respect to another fourth signal; and
   a third signal coupling stage having
      fifth means, coupled to said second and fourth means, for selectively combining said pluralities of second and fourth output signals and producing therefrom a plurality of fifth output signals each of which has a magnitude component representative of the magnitude of said first and second input signals, and a phase component representative of a prescribed relationship between the phases of said first and second input signals.

2. A signal coupling network according to claim 1, wherein said prescribed relationship is representative of the difference between the phases of said first and second input signals.

3. A signal coupling network according to claim 1, wherein each of said first and third means comprises parallel all-pass networks and each of said second and fourth means comprises a respective multiple differential amplifier circuit producing at complementary outputs thereof respective ones of said plurality of second output signals and said plurality of fourth output signals.

4. A signal coupling network according to claim 1, wherein each of said second and fourth means comprises means for producing four output signals the phases of which are offset with respect to each other, so that the four output signals may be effectively represented by four phase vectors having relative phase values of 0°, +90°, −90°, and +180°.

5. A signal coupling network according to claim 3, wherein said all-pass networks comprise respective networks of signal coupling elements exclusive of inductor elements.

6. A signal coupling network according to claim 1, wherein said fifth means comprises a plurality of square law detector circuits coupled to receive selected pairs of second and fourth output signals and producing therefrom said plurality of fifth output signals.

7. A signal coupling network according to claim 6, wherein each of said second and fourth means comprises means for producing four output signals the phases of which are offset with respect to each other, so that the four output signals may be effectively represented by four phase vectors having relative phase values of 0°, +90°, −90°, and +180°.

8. A signal coupling network according to claim 7, wherein each of said first and third means comprises parallel all-pass networks and each of said second and fourth means comprises a respective multiple differential amplifier circuit producing at complementary outputs thereof respective ones of said plurality of second output signals and said plurality of fourth output signals.

9. A signal coupling network according to claim 8, wherein said all-pass networks comprise respective networks of signal coupling elements exclusive of inductor elements.

* * * * *